United States Patent
Chai et al.

(10) Patent No.: US 11,163,013 B2
(45) Date of Patent: Nov. 2, 2021

(54) ELECTRICAL DEVICE PARTIAL DISCHARGE MONITORING

(71) Applicant: Hamilton Sundstrand Corporation, Charlotte, NC (US)

(72) Inventors: Huazhen Chai, Caledonia, IL (US); Jonas Mukamba Muteba, Roscoe, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 134 days.

(21) Appl. No.: 16/668,970

(22) Filed: Oct. 30, 2019

(65) Prior Publication Data

US 2021/0132157 A1 May 6, 2021

(51) Int. Cl.
*G01R 31/40* (2020.01)

(52) U.S. Cl.
CPC .................. *G01R 31/40* (2013.01)

(58) Field of Classification Search
CPC ... G01R 31/40; G01R 31/008; G01R 31/1272
USPC .................. 324/764.01, 537, 500
See application file for complete search history.

(56) References Cited

U.S. PATENT DOCUMENTS

| | | | |
|---|---|---|---|
| 8,203,814 B2 | 6/2012 | Farr | |
| 10,171,023 B2 | 1/2019 | Vaneyll et al. | |
| 10,236,808 B2 | 3/2019 | Murray et al. | |
| 2010/0277199 A1 | 11/2010 | Cusido I Roura et al. | |
| 2010/0299090 A1 | 11/2010 | Hobelsberger et al. | |
| 2012/0330871 A1 | 12/2012 | Asiri | |
| 2014/0320139 A1 | 10/2014 | Renforth et al. | |
| 2017/0295670 A1* | 10/2017 | Campbell | H05K 7/20236 |
| 2018/0031625 A1* | 2/2018 | Pezzin | G01R 31/52 |
| 2018/0120380 A1 | 5/2018 | Giussani et al. | |
| 2018/0321321 A1 | 11/2018 | Rodriguez et al. | |
| 2020/0327999 A1* | 10/2020 | Mills | G21B 3/004 |
| 2020/0403555 A1* | 12/2020 | Mills | G21B 1/00 |
| 2021/0086635 A1* | 3/2021 | Ueda | H05K 7/1432 |
| 2021/0132140 A1* | 5/2021 | Tsai | G01R 31/2817 |

FOREIGN PATENT DOCUMENTS

| | | |
|---|---|---|
| KR | 101232750 B1 | 2/2013 |
| WO | 2013093800 A1 | 6/2013 |

OTHER PUBLICATIONS

Alvarez et al., "Application of HFCT and UHF Sensors in On-Line Partial Discharge Measurements for Insulation Diagnosis of High Voltage Equipment", Sensors, vol. 15, No. 4, Mar. 25, 2015, pp. 1-28.
Extended European Search Report for EP Application No. 19216130.5 dated Jul. 17, 2020, pp. 1-8.

* cited by examiner

*Primary Examiner* — Giovanni Astacio-Oquendo
(74) *Attorney, Agent, or Firm* — Cantor Colburn LLP

(57) ABSTRACT

An electrical device includes a housing defining a chamber, a power converter arranged within the chamber, and a sensor. The sensor includes a coil arranged within the chamber and in radio frequency communication with the power converter to detect partial discharge of a voltage potential applied to the power converter. Health monitoring systems and health monitoring methods are also described.

19 Claims, 6 Drawing Sheets

ELECTRICAL DEVICE PARTIAL DISCHARGE MONITORING

BACKGROUND

The present disclosure is generally related to electrical systems, and more particularly to partial discharge monitoring in electrical devices in electrical systems.

Electrical systems, such as on aircraft, commonly include conductors to route electrical power between power sources and electrical loads connected to the electrical systems. The conductors are generally electrically insulated to prevent discharge of voltage potential applied to the conductors and structures having different potentials. The electrical insulation typically encloses the conductors at locations both between the between power source and the electrical devices connected to the electrical system as well as at various locations within certain electrical devices of the electrical system.

In some electrical systems the electrical insulation can degrade over time. As the electrical insulation degrades the likelihood of discharge events between energized conductors and structures having different potentials increases, such as conductors having lower potentials, reducing the reliability of the electrical system. To monitor for incipient insulation degradation Corona monitoring may be employed. Corona monitoring generally entails monitoring an energized conductor for partial discharge events, e.g., charge leakage of magnitude sufficient to present an audible, visual, or electromagnetic signal, but of magnitude insufficient to discharge the energized conductor. Electromagnetic signals associated with such partial discharge events between electrical devices can be detected by high-frequency capacitors. Internal monitoring conductors within electrical devices can be more difficult due to the size of such high-frequency capacitors.

Such systems and methods having generally been satisfactory for their intended purpose. However, there remains a need in the art for improved electrical devices, health monitoring systems, and health monitoring methods.

BRIEF DESCRIPTION

An electrical device is provided. The electrical device includes a housing defining a chamber, a power converter arranged within the chamber, and a sensor. The sensor includes a coil arranged within the chamber and in radio frequency communication with the power converter to detect partial discharge of a voltage potential applied to the power converter.

In addition to one or more of the features described above, or as an alternative, further examples of the electrical device may include that the coil is a first coil and further comprising a second coil, the second coil arranged within the housing.

In addition to one or more of the features described above, or as an alternative, further examples of the electrical device may include that the second coil is in radio frequency communication within the housing with the power converter.

In addition to one or more of the features described above, or as an alternative, further examples of the electrical device may include that the second coil is electromagnetically segregated within the housing from the first coil.

In addition to one or more of the features described above, or as an alternative, further examples of the electrical device may include an interior electromagnetic shield arranged within the interior of the housing and separating the first coil from the second coil.

In addition to one or more of the features described above, or as an alternative, further examples of the electrical device may include that the second coil is electrically connected in series with the first coil.

In addition to one or more of the features described above, or as an alternative, further examples of the electrical device may include that the second coil is electrically isolated from the first coil.

In addition to one or more of the features described above, or as an alternative, further examples of the electrical device may include that the coil is a first straight coil and further comprising a second straight coil.

In addition to one or more of the features described above, or as an alternative, further examples of the electrical device may include that the first straight coil is arranged along a first coil axis, wherein the second straight coil is arranged along a second coil axis, and wherein the second coil axis is parallel to the first coil axis.

In addition to one or more of the features described above, or as an alternative, further examples of the electrical device may include that the first straight coil is arranged along a first coil axis, that the second straight coil is arranged along a second coil axis, and that the second coil axis is angled relative to the first coil axis.

In addition to one or more of the features described above, or as an alternative, further examples of the electrical device may include that the coil is a straight coil and further comprising an enclosed coil, the enclosed coil in radio frequency communication with the power converter.

In addition to one or more of the features described above, or as an alternative, further examples of the electrical device may include that at least one of an electrically insulated input cable and an electrically insulated output cable extending through the housing and electrically connected to the power converter, wherein the enclosed coil extends at least partially about the at least one of the electrically insulated input cable and the electrically insulated output cable.

In addition to one or more of the features described above, or as an alternative, further examples of the electrical device may include an interior electromagnetic shield arranged within the housing and electromagnetically segregating the enclosed coil from the straight coil.

In addition to one or more of the features described above, or as an alternative, further examples of the electrical device may include that the coil is a first enclosed coil and that the electrical device includes a second enclosed coil arranged within the interior of the housing.

In addition to one or more of the features described above, or as an alternative, further examples of the electrical device may include an input cable extending through the housing and electrically connected to the power converter, and an output cable extending through the housing and electrically connected to the input cable by the power converter. The first enclosed coil extends at least partially about the input cable, and wherein the second enclosed coil extends at least partially about the output cable.

In addition to one or more of the features described above, or as an alternative, further examples of the electrical device may include that the electrical device is a motor controller configured as a line replaceable unit for an aircraft electrical system.

In addition to one or more of the features described above, or as an alternative, further examples of the electrical device may include that the power converter includes a solid-state inverter, and further comprising a synchronous electric motor electrically connected to the solid-state inverter, the synchronous electric motor thereby operatively associated with the power converter.

A health monitoring system is also provided. The health monitoring system includes an electrical device as described above, wherein the electrical device is a motor controller configured as a line replaceable unit for an aircraft electrical system; a processor disposed in communication with the sensor and a memory having instructions recorded on the memory to: detect a partial discharge within the housing of the electrical device; and display magnitude of the partial discharge on a user interface operatively associated with the processor, or compare the magnitude of the partial discharge to a predetermined count value, increment a count value when the magnitude of the partial discharge exceeds the predetermined count value, and initiate an alarm or trip action when the count value exceeds an alarm or trip threshold value.

A health monitoring method is additionally provided. The health monitoring method includes, at an electrical device as described, detecting partial discharge of a voltage potential applied to the power converter, displaying magnitude of the partial discharge on a user, and comparing the magnitude of the partial discharge to a predetermined count value. A count value is incremented when the magnitude of the partial discharge exceeds the predetermined count value. An alarm or trip action is initiated when the count value exceeds an alarm or trip threshold value.

In addition to one or more of the features described above, or as an alternative, further examples of the electrical device may include receiving source electric power, inverting the source electric power into load electric power, communicating the load electric power to a synchronous electric motor operatively associated with the electrical device, and partially discharging, from an energized structure arranged within the housing of the electrical device, the potential associated with the source electric power.

Technical effects of the present disclosure include online Corona detection with little increase in weight and complexity of the electrical device being monitored. Technical effects also include galvanic isolation between the detection circuit and the conductor being monitored, limiting invasiveness and risk otherwise associated with the monitoring. Technical effects also include radio frequency coupling of the detection circuit (e.g., the sensor) with the monitored circuit (e.g., the power converter and/or input cable and output cable), limiting (or eliminating entirely) capacitive ground currents and leaving unchanged the electromagnetic interference signature of the electrical device being monitored.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
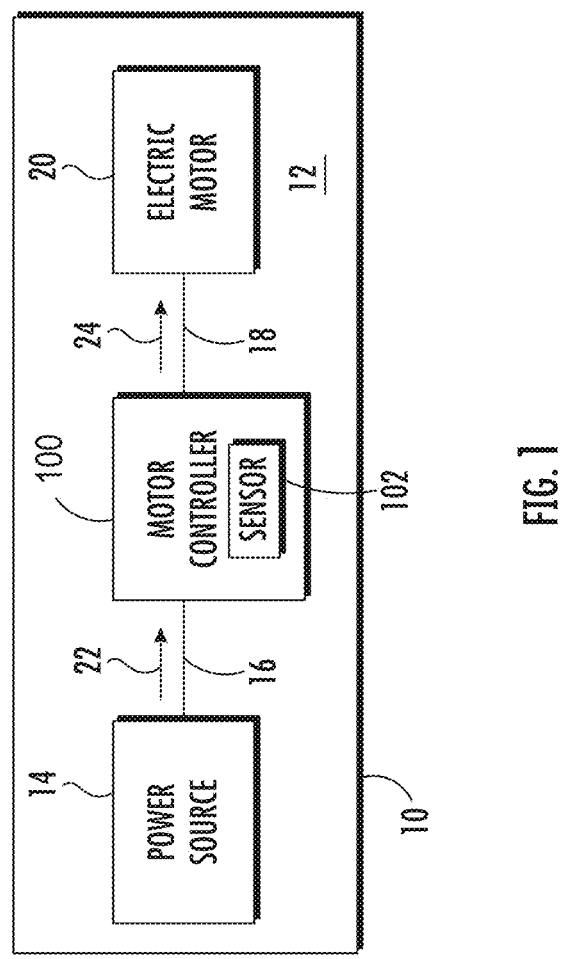
FIG. 1 is a schematic view of an electrical system constructed in accordance with the present disclosure, showing a motor controller electrical device connecting a power source with an electric motor and having arranged therein a partial discharge monitoring coil.

Reference will now be made to the drawings wherein like reference numerals identify similar structural features or aspects of the subject disclosure. For purposes of explanation and illustration, and not limitation, a partial view of an example implementation of a motor controller electrical device constructed in accordance with the disclosure is shown in FIG. 1 and is designated generally by reference character 100. Other embodiments of motor controller electrical devices, electrical device health monitoring systems, and methods of monitoring electrical device health in accordance with the present disclosure, or aspects thereof, are provided in FIGS. 2-8, as will be described. The systems and methods described herein can be used for monitoring health of electrical devices, such as in motor controllers configured as line replaceable units for aircraft electrical systems, though the present disclosure is not limited to motor controllers or to electrical devices for aircraft electrical systems generally.

Referring to FIG. 1, a vehicle 10, e.g., an aircraft, is shown. The vehicle 10 includes an electrical system 12 with a power source 14, a source lead 16, the motor controller electrical device 100, a load lead 18, and an electric motor 20. The power source 14 is arranged to generate a flow of source electric power 22. The source lead 16 is electrically connected to the power source 14 and is arranged to communicate the source electric power 22 to the motor controller electrical device 100. The motor controller electrical device 100 is connected to the source lead 16 and is arranged to convert the flow of source electric power 22 into a flow of the load electric power 24 for the electric motor 20. The load lead 18 electrically connects the motor controller electrical device 100 to the electric motor 20 and is arranged to communicate the flow of load electric power 24 to the electric motor 20. The electric motor 20 is operably associated with the motor controller electrical device 100, e.g., rotational speed and/or direction being controlled using the load according to frequency or voltage of the flow of load electric power 24. Although shown and described herein in the context of a motor controller electrical device 100 it is to be understood and appreciated that other types of electrical devices can also benefit from the present disclosure, such as generator electrical devices and motor electric devices by way of non-limiting examples.

As will be appreciated by those of skill in the art in view of the present disclosure, electrical insulation is some electrical devices can degrade over time. Absent intervention such degradation can cause energized structures within the electrical device to discharge voltage potential applied to the energized structure to discharge to a lower potential structure, potentially limiting reliability of the electrical device. To detect incipient discharge risk the motor controller electrical device 100 includes the partial discharge sensor 102. The partial discharge sensor 102 is arranged within the motor controller electrical device 100 and is configured to generate a signal 26 indicative of partial discharge events, e.g., Corona, from energized structures within the motor controller electrical device 100. This allows the motor controller electrical device 100 to be scheduled for maintenance and/or replacement prior the motor controller electrical device 100 experiencing an energized structure discharge event, such as can result from insulation degradation of various structures within the motor controller electrical device 100.

Figure 2:
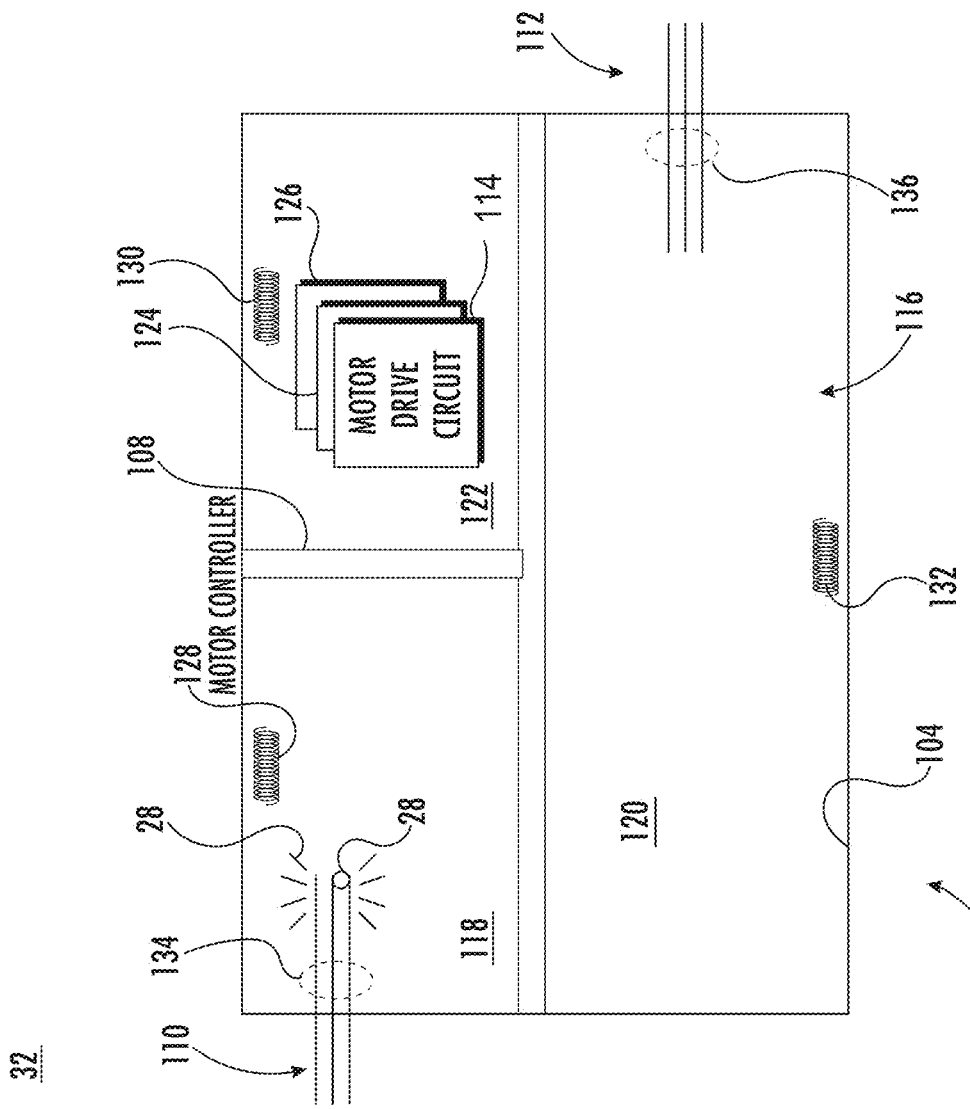
FIG. 2 is a schematic view of the partial discharge monitoring coil arranged within the motor controller of FIG. 1 according to an example, showing an arcuate partial discharge monitoring coil.

With reference to FIG. 2, the motor controller electrical device 100 is shown according to an example. The motor controller electrical device 100 includes a housing 104, an exterior electromagnetic shield 106, and interior electromagnetic shield 108. The motor controller electrical device 100 also includes an electrically insulated input cable 110, an electrically insulated output cable 112, and a power converter 114. In certain examples the motor controller electrical device 100 is configured as a line replaceable unit for an aircraft electrical system, e.g., the electrical system 12 (shown in FIG. 1).

The housing 104 defines an interior 116. The exterior electromagnetic shield 106 bounds the interior 116 of the housing 104 and is arranged to limit (or eliminate entirely) communication of a radio frequency electromagnetic field 28 associated with a partial discharge event 30. The interior electromagnetic shield 108 segregates the interior 116 of the housing 104 into a plurality of chambers, e.g., an input cable chamber 118, an output cable chamber 120, and a power converter chamber 122, and is arranged to provide radio frequency electromagnetic segregation of each of the plurality of chambers from the other(s) of the plurality of chambers. For example, when a partial discharge event occurs in one of the input cable chamber 118, the output cable chamber 120, and the power converter chamber 122 the interior electromagnetic shield 108 limits (or prevents entirely) communication of the radio frequency electromagnetic field to the others of the input cable chamber 118, the output cable chamber 120, and the power converter chamber 122.

The electrically insulated input cable 110 is electrically connected to the source lead 16 (shown in FIG. 1) and extends through the housing 104 and into the interior 116 of the housing 104, e.g., into the input cable chamber 118. The electrically insulated input cable 110 is electrically connected to the power converter 114 and is arranged to communicate the source electric power 22 (shown in FIG. 1) received from the source lead 16 to the power converter 114.

The electrically insulated output cable 112 is electrically connected to the power converter 114 and extends from the interior 116 of the housing 104, e.g., the output cable chamber 120, to the environment 32 external of the motor controller electrical device 100. The electrically insulated output cable 112 is electrically connected to the load lead 18 (shown in FIG. 1) and is arranged to communicate the load electric power 24 (shown in FIG. 1) received from the power converter 114.

The power converter 114 arranged within the power converter chamber 122 and electrically couples the electrically insulated input cable 110 to the electrically insulated output cable 112. The power converter 114 is further configured to drive the electric motor 20 (shown in FIG. 1) through modulation of the load electric power 24, e.g., by altering either (or both) voltage of the load electric power 24. In certain examples the power converter 114 includes a solid-state rectifier circuit 124. In accordance with certain examples the power converter 114 includes a solid-state inverter 126. It is also contemplated that, in accordance with certain examples, the motor controller electrical device 100 not include a transformer, limiting size and/or weight of the motor controller electrical device 100 and allowing the motor controller electrical device 100 to employed in an aircraft electrical system, e.g., the aircraft electrical system 12 (shown in FIG. 1).

The partial discharge sensor 102 includes at least a first coil, e.g., one of a straight coil, e.g., an input cable chamber straight coil 128, a power converter chamber straight coil 130 and an output cable chamber straight coil 132; and an enclosed coil, e.g., an input cable chamber enclosed coil 134 and an output cable chamber enclosed coil 136. In certain embodiments the partial discharge sensor 102 includes a first coil and a second coil, e.g., two of the input cable chamber straight coil 128, the power converter chamber straight coil 130, the output cable chamber straight coil 132, the input cable chamber enclosed coil 134, and the output cable chamber enclosed coil 136. It is contemplated that the partial discharge sensor 102 can include a first straight coil and a second straight coil, e.g., two of the input cable chamber straight coil 128, the power converter chamber straight coil 130, and the output cable chamber straight coil 132. It is also contemplated that the partial discharge sensor 102 can include a first enclosed coil and a second enclosed coil, e.g., the input cable chamber enclosed coil 134 and the output cable chamber enclosed coil 136. In the illustrated example implementation of the motor controller electrical device 100 the input cable chamber straight coil 128 and the input cable chamber enclosed coil 134 are arranged in the input cable chamber 118, the power converter chamber straight coil 130 is arranged in the power converter chamber 122, and the output cable chamber enclosed coil 136 and output cable chamber straight coil 132 are arranged in the output cable chamber 120.

Figure 3:
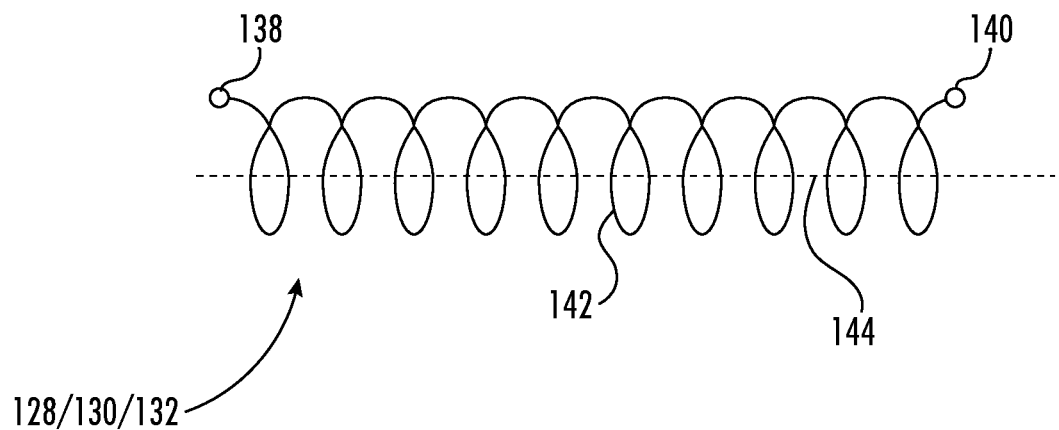
FIG. 3 is a schematic view of one of the partial discharge monitoring coil of the motor controller electrical device of FIG. 1 according to an example, showing a partial discharge monitoring liner coil.

As shown FIG. 3, the power converter chamber straight coil 130 includes a straight coil first terminal 138, a straight coil second terminal 140, and a straight coil 142. The straight coil first terminal 138 and the straight coil second terminal 140 are each arranged along a straight coil axis 144. The straight coil 142 extends helically about the straight coil axis 144 and electrically connects the straight coil first terminal 138 to the straight coil second terminal 140. The power converter chamber straight coil 130 and output cable chamber straight coil 132 are similar to the input cable chamber straight coil 128 and are additionally arranged within the output cable chamber 120 and the power converter chamber 122, respectively. In this respect the input cable chamber straight coil 128 is in radio frequency communication with the interior 116 of the housing 104, e.g., for detecting changing magnetic field along a straight coil axis of the input cable chamber straight coil 128 within the input cable chamber 118; the power converter chamber straight coil 130 is in radio frequency communication with the interior 116 of the housing 104, e.g., for detecting changing magnetic field along a straight coil axis of the power converter chamber straight coil 130 within the power converter chamber 122; and the output cable chamber straight coil 132 is in radio frequency communication with the interior of interior 116 of the housing 104, e.g., for detecting cha for detecting changing magnetic field along a straight coil axis of the output cable chamber straight coil 132 within the output cable chamber 120. Although the partial discharge sensor 102 is shown as having five (5) coils in the example implementation shown in FIG. 3, it is to be understood and appreciated that the motor controller electrical device 100 can have fewer or more than five (5) coils and remain within the scope of the present disclosure.

Figure 4:
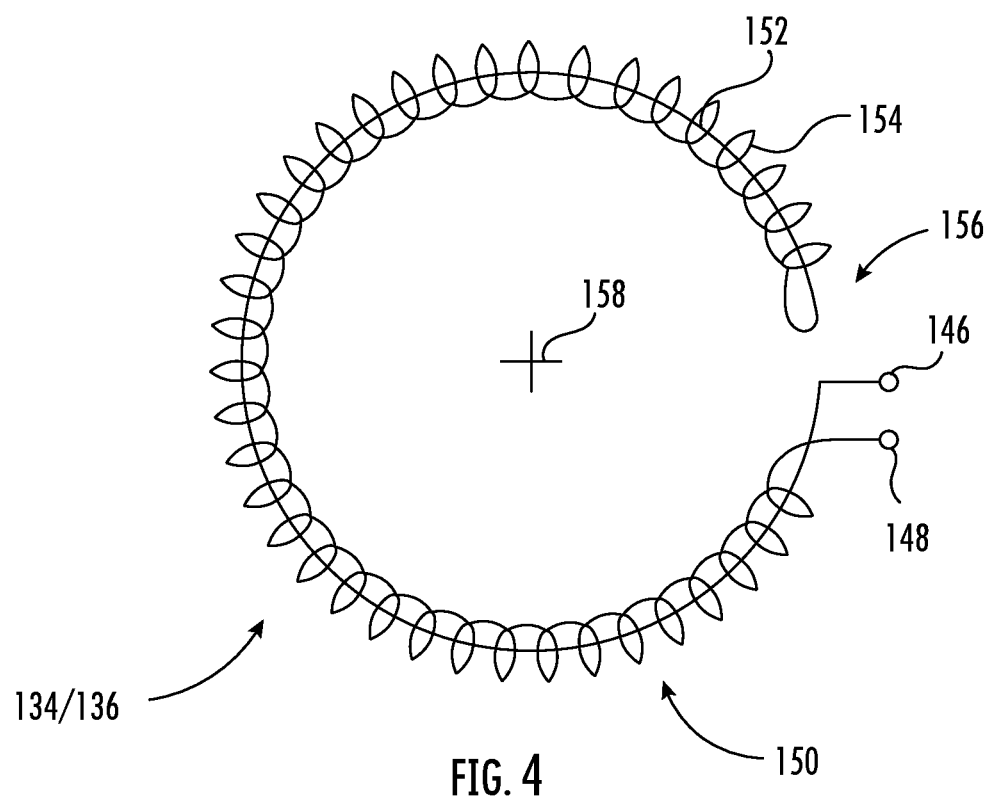
FIG. 4 is a schematic view of the another of the partial discharge monitoring coil of the motor controller electrical device of FIG. 1 according to the example, showing a partial discharge monitoring enclosed coil.

As shown in FIG. 4, the input cable chamber enclosed coil 134 is shown. The input cable chamber enclosed coil 134 includes an enclosed coil first terminal 146, an enclosed coil second terminal 148, and an enclosed coil 150. The enclosed coil 150 electrically connects the enclosed coil first terminal 146 with the enclosed coil second terminal 148 and includes an arcuate portion 152 and a helical portion 154. The arcuate portion 152 extends from the enclosed coil first terminal 146 to a coil terminus 156 about an enclosed coil axis 158. The helical portion 154 extends from the arcuate portion 152 at the coil terminus 156, traces a helical path about the arcuate portion 152, and terminates at the enclosed coil second terminal 148. The electrically insulated input cable 110 is arranged along the enclosed coil axis 158 and is enclosed (at least partially) with the arcuate portion 152 and the helical portion 154 of the enclosed coil 150. The output cable chamber enclosed coil 136 is similar to the input cable chamber enclosed coil 134 and is arranged within the output cable chamber 120.

With continuing reference to FIG. 2, when a partial discharge event occurs within the interior 116 of the housing 104, e.g., the partial discharge event 30, the partial discharge event generates an associated radio frequency electromagnetic field, e.g., the radio frequency electromagnetic field 28. The radiofrequency electromagnetic field radiates within the interior 116 of the housing 104, e.g., within one of the plurality of electromagnetically segregated spaces defined within the housing 104, and is conducted along the electrically insulated input cable 110, the electrically insulated output cable 112 within the interior 116 of the housing 104, and/or through the power converter 114. It is contemplated the partial discharge sensor 102 detect the radio frequency electromagnetic field 28 associated with the partial discharge event 30, provide the signal 26 indicative of the partial discharge event 30, and communicate the signal to the health monitoring system 200 for monitoring health of the motor controller electrical device 100.

More specifically, it is contemplated that one or more of the straight coils of the partial discharge sensor, e.g., the input cable chamber straight coil 128, the power converter chamber straight coil 130, and the output cable chamber straight coil 132, detect change in the nominal electromagnetic field within the housing 104 along a straight coil axis defined by the coil, e.g., the straight coil axis 144. It is also contemplated that enclosed coils of the partial discharge sensor 102, e.g., the power converter chamber straight coil 130 and the output cable chamber straight coil 132, detects the loop integration of changing magnetic field along a helical coil axis of the enclosed coil, e.g., the enclosed coil axis 158. For example, the loop integration of the changing magnetic field can be according to $d(i_a+i_b+i_c)/dt$ where $i_a$ is a-phase current, $i_b$ is b-phase current, and $i_c$ is c-phase current.

Figure 5:
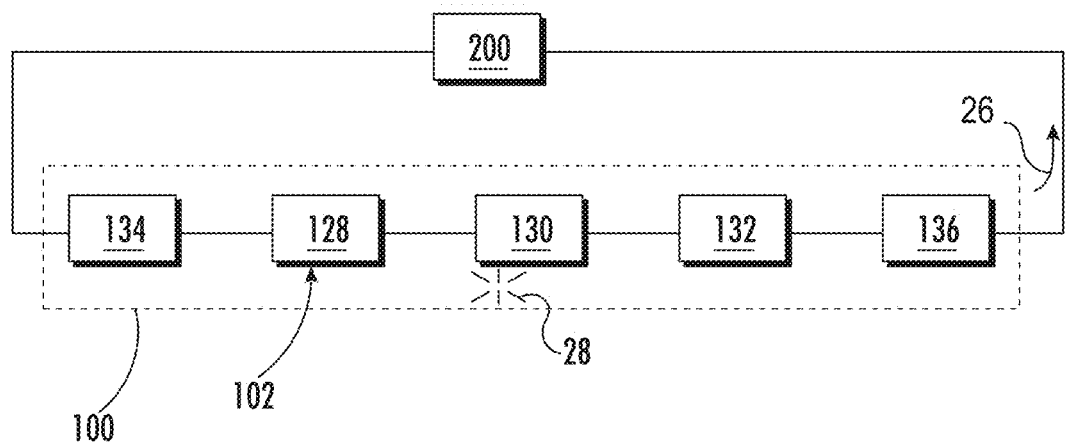
FIGS. 5 and 6 are schematic views of the motor controller electrical device of FIG. 1 according to examples, showing coils of the sensor connected electrically in series with one another and electrically isolated from one another, respectively.
Figure 6:
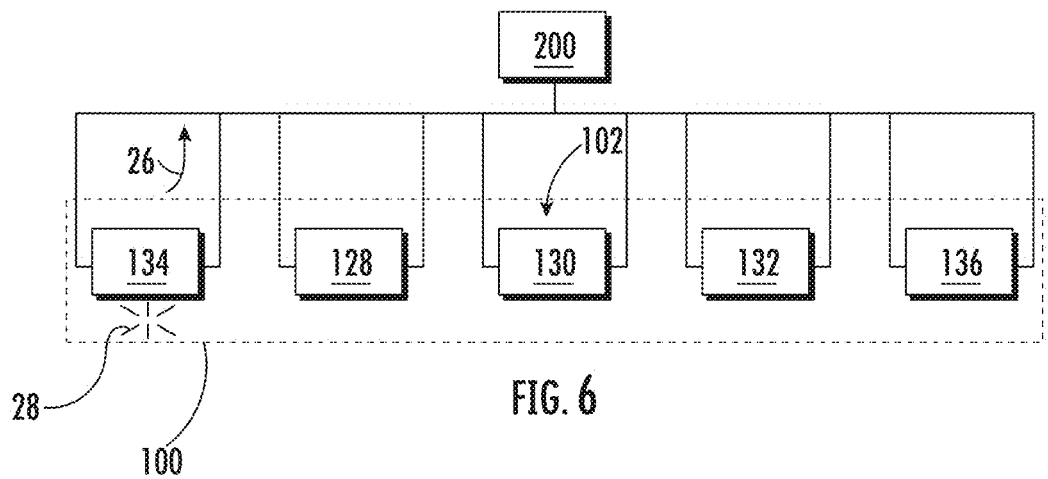

As will be appreciated by those of ordinary skill in the art in view of the present disclosure, any one of the coils, e.g., the input cable chamber straight coil 128, the power converter chamber straight coil 130, the output cable chamber straight coil 132, the input cable chamber enclosed coil 134, and the output cable chamber enclosed coil 136, can be employed to detect the partial discharge event 30. Advantageously, placing the input cable chamber enclosed coil 134 about the electrically insulated input cable 110, the output cable chamber enclosed coil 136 about the electrically insulated output cable 112, and straight coils in adjacent chambers on opposite sides of the interior electromagnetic shield 108 (as shown in the illustrated example) increases the likelihood of detecting a relatively weak partial discharge—providing a relatively early indication of insulation breakdown with the motor controller electrical device 100. In certain examples and as shown in FIG. 5, two or more of the coils are connected electrically in series with one another, increasing sensitivity of the partial discharge sensor 102 through increase in the signal to noise ratio of the partial discharge sensor 102. In accordance with certain examples and as shown in FIG. 6, two or more of the coils can be electrically isolated from one another, allowing isolation of partial discharge events to an individual electromagnetically segregated chamber of the motor controller electrical device 100.

Figure 7:
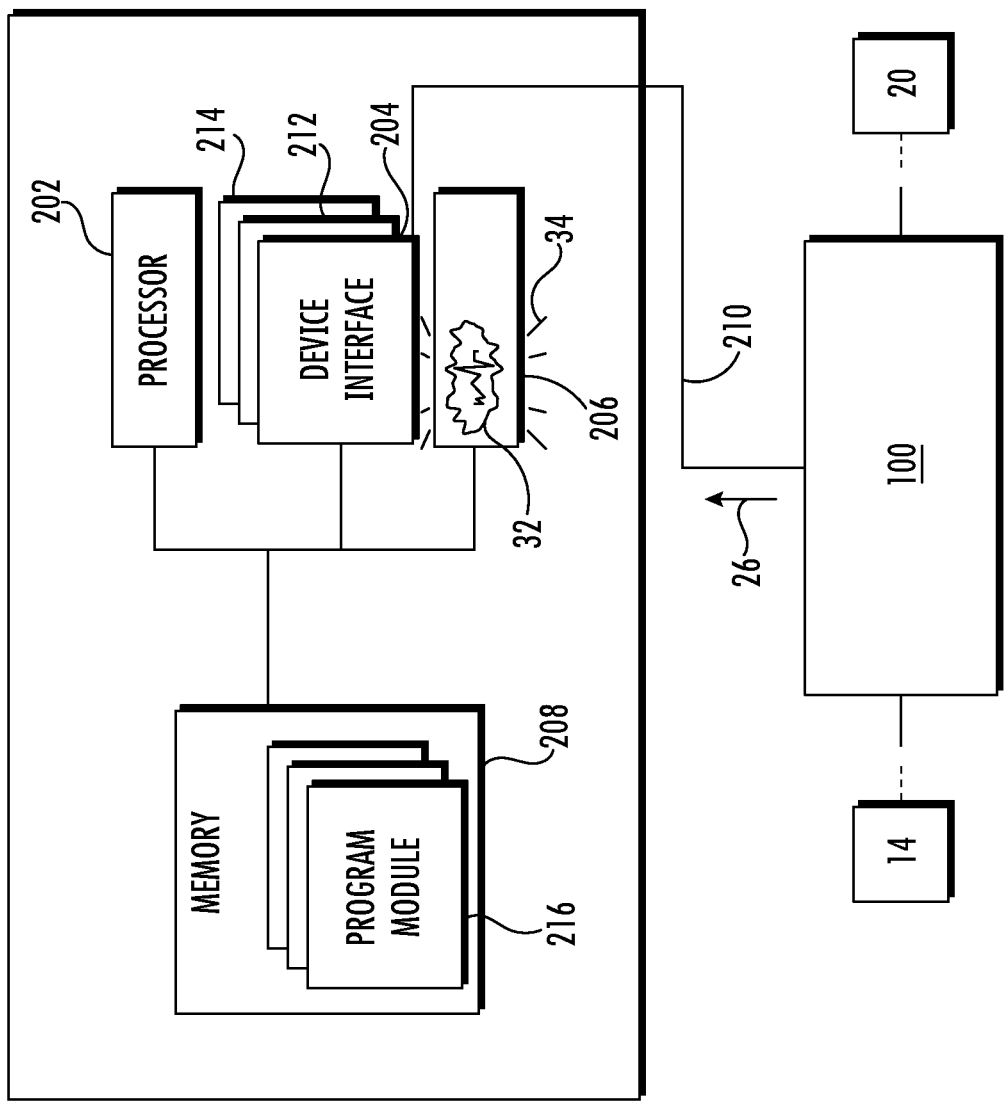
FIG. 7 is a schematic view of a health monitoring system including the motor controller electrical device of FIG. 1, showing the health monitoring system detecting a partial discharge event within the motor controller electrical device with the sensor.

With reference to FIG. 7, the health monitoring system 200 is shown. The health monitoring system 200 includes a processor 202, a device interface 204, a user interface 206, and a memory 208. The processor 202 is operatively connected to the user interface 206 and is disposed in communication with the device interface 204. The device interface 204 in turn connects the processor 202 to the partial discharge sensor 102 through a link 210. In certain examples the device interface 204 can include a signal conditioning circuit 212 and/or a comparator circuit 214, which individually (or collectively) allow health monitoring of the motor controller electrical device 100 to be accomplished without displaying a trace of magnitude of partial discharge events to a user on the user interface 206.

The memory 208 has a plurality of program modules 216 recorded on the memory that, when read by the processor 202, cause the processor to execute certain operations. Among those operations are operations of a health monitoring method 300 (shown in FIG. 8), as will be described. In certain examples the instructions recorded in the plurality of program modules 216 cause the user interface to display magnitude, e.g., a trace 36, the user interface displaying magnitude a partial discharge event within the motor controller electrical device 100 on the user interface 206. In accordance with certain examples the instructions recorded in the plurality of program modules cause the user interface 206 to initiate an alarm or trip action 34 in response to a partial discharge event (or count of partial discharge events exceeding a predetermined value.

Figure 8:
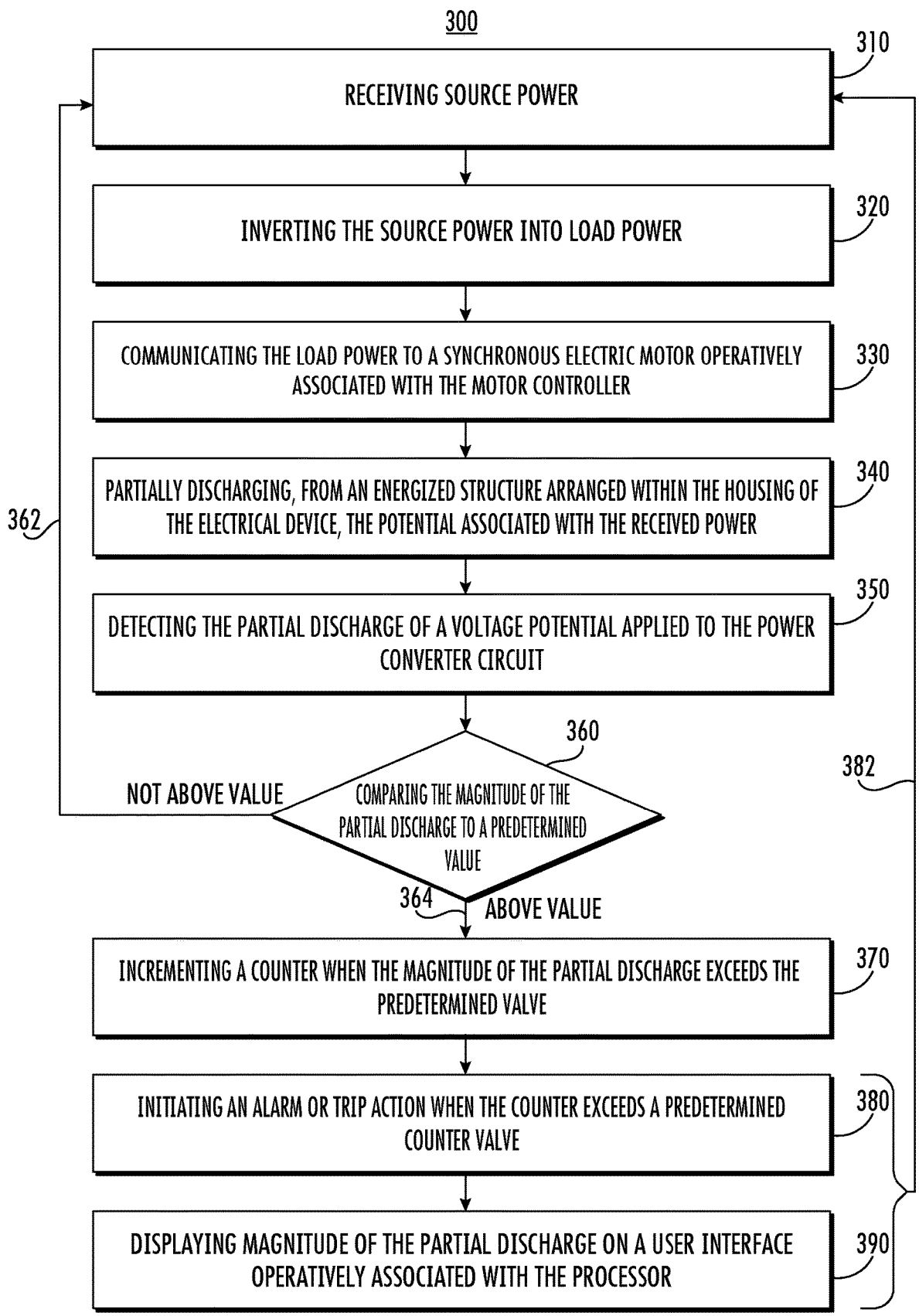
FIG. 8 is a block diagram of a health monitoring method, showing operations of the method according to an illustrative and non-limiting example of the method.

With reference to FIG. 8, the health monitoring method 300 is shown. As shown with box 310, the method 300 includes receiving source electric power at an electrical device, e.g., the source electric power 22 (shown in FIG. 1) by the motor controller electrical device 100 (shown in FIG. 1). The source power is inverted into load power, e.g., the load electric power 24 (shown in FIG. 1), as shown with box 320. The load power is then communicated to a synchronous electric motor that is operatively associated with the motor controller electrical device, e.g., the electric motor 20 (shown in FIG. 1).

As shown with box 340, an energized structure within the motor controller electrical device is partially discharged. The energized structure can be an electrically insulated input cable arranged within the motor controller electrical device, e.g., the electrically insulated input cable 110 (shown in FIG. 2). The energized structure can be an electrically insulated output cable within the motor controller electrical device, e.g., the electrically insulated output cable 112 (shown in FIG. 2). It is also contemplated that the energized structure can be a power converter or an inverter arranged within the motor controller electrical device, e.g., the power converter 114 (shown in FIG. 2) or the solid-state inverter 126 (shown in FIG. 2).

As shown with box 350, the partial discharge of the energized structure is detected by a sensor arranged within the motor controller electrical device, e.g., the partial discharge sensor 102 (shown in FIG. 2). It is contemplated that the sensor generate a signal indicative of the partial discharge event, e.g., the signal 26 (shown in FIG. 5) responsive the radio frequency electromagnetic field 28 (shown in FIG. 2) associated with a partial discharge event 30 (shown in FIG. 2). In certain examples the signal is generated by a partial discharge monitoring linear coil, e.g., the input cable chamber straight coil 128 (shown in FIG. 2). In accordance with certain examples the signal is generated by a partial discharge monitoring enclosed coil, e.g., the input cable chamber enclosed coil 134 (shown in FIG. 2). It is also contemplated that the signal can be reported by two or more partial discharge monitoring coils connected electrically in series with one another, as shown in FIG. 5.

As shown with box 360, the magnitude of the partial discharge is compared to a predetermined count value. When the magnitude of the partial discharge is below the predetermined count value no action is taken and monitoring continues, as shown with arrow 362. When the magnitude of the partial discharge is above the predetermined count value a counter value is incremented, as shown with arrow 364 and box 370. Further, an alarm of a trip action is taken when the counter value exceeds an alarm or trip threshold value, as shown with box 380. Optionally, as shown with arrow 382, monitoring may continue and the motor controller electrical device remain in service. In certain examples magnitude of the partial discharge event is displayed on a user interface, e.g., the user interface 206 (shown in FIG. 7).

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electrical device, comprising:
   a housing defining a chamber;
   a power converter arranged within the chamber; and
   a sensor including a coil arranged within the chamber and in radio frequency communication with the power converter to detect partial discharge of a voltage potential applied to the power converter, wherein the coil is a first straight coil and the sensor further includes a second straight coil.

2. The electrical device of claim 1, wherein the coil is a first coil and further comprising the second coil, the second coil arranged within the housing.

3. The electrical device of claim 2, wherein the second coil is in radio frequency communication within the housing with the power converter.

4. The electrical device of claim 2, wherein the second coil is electromagnetically segregated within the housing from the first coil.

5. The electrical device of claim 2, further comprising an interior electromagnetic shield arranged within the interior of the housing and separating the first coil from the second coil.

6. The electrical device of claim 2, wherein the second coil is electrically connected in series with the first coil.

7. The electrical device of claim 2, wherein the second coil is electrically isolated from the first coil.

8. The electrical device of claim 1, wherein the first straight coil is arranged along a first coil axis, wherein the second straight coil is arranged along a second coil axis, and wherein the second coil axis is parallel to the first coil axis.

9. The electrical device of claim 1, wherein the first straight coil is arranged along a first coil axis, wherein the second straight coil is arranged along a second coil axis, and wherein the second coil axis is angled relative to the first coil axis.

10. The electrical device of claim 1, wherein the coil is a straight coil and further comprising an enclosed coil, the enclosed coil in radio frequency communication with the power converter.

11. The electrical device of claim 10, further comprising at least one of an electrically insulated input cable and an electrically insulated output cable extending through the housing and electrically connected to the power converter, wherein the enclosed coil extends at least partially about the at least one of the electrically insulated input cable and the electrically insulated output cable.

12. The electrical device of claim 10, further comprising an interior electromagnetic shield arranged within the housing and electromagnetically segregating the enclosed coil from the straight coil.

13. The electrical device of claim 1, wherein the coil is a first enclosed coil and further comprising a second enclosed coil arranged within the interior of the housing.

14. The electrical device of claim 13, further comprising:
   an input cable extending through the housing and electrically connected to the power converter; and
   an output cable extending through the housing and electrically connected to the input cable by the power converter, wherein the first enclosed coil extends at least partially about the input cable, and wherein the second enclosed coil extends at least partially about the output cable.

15. The electrical device of claim 1, wherein the electrical device is a motor controller configured as a line replaceable unit for an aircraft electrical system.

16. The electrical device of claim 1, wherein the power converter includes a solid-state inverter, and further comprising a synchronous electric motor electrically connected to the solid-state inverter, the synchronous electric motor thereby operatively associated with the power converter.

17. A health monitoring system, comprising:
- an electrical device as recited in claim 1, wherein the electrical device is a motor controller configured as a line replaceable unit for an aircraft electrical system;
- a processor disposed in communication with the sensor and a memory having instructions recorded on the memory to:
  - detect a partial discharge within the housing of the electrical device; and
  - display magnitude of the partial discharge on a user interface operatively associated with the processor, or
  - compare the magnitude of the partial discharge to a predetermined count value, increment a count value when the magnitude of the partial discharge exceeds the predetermined count value, and initiate an alarm or trip action when the count value exceeds an alarm or trip threshold value.

18. A health monitoring method, comprising:
- at an electrical device having a housing defining a chamber, a power converter arranged within the chamber, and a sensor including a coil arranged within the chamber and in radio frequency communication with the power converter,
- detecting partial discharge of a voltage potential applied to the power converter;
- displaying magnitude of the partial discharge on a user, or
- comparing the magnitude of the partial discharge to a predetermined count value, incrementing a count value when the magnitude of the partial discharge exceeds the predetermined count value, and initiating an alarm or trip action when the count value exceeds an alarm or trip threshold value.

19. The health monitoring method of claim 18, further comprising:
- receiving source electric power;
- inverting the source electric power into load electric power;
- communicating the load electric power to a synchronous electric motor operatively associated with the electrical device; and
- partially discharging, from an energized structure arranged within the housing of the electrical device, the potential associated with the source electric power.

* * * * *